United States Patent [19]
Yamazaki et al.

[11] Patent Number: 5,834,327
[45] Date of Patent: Nov. 10, 1998

[54] METHOD FOR PRODUCING DISPLAY DEVICE

[75] Inventors: Shunpei Yamazaki, Tokyo; Setsuo Nakajima; Yasuyuki Arai, both of Kanagawa, all of Japan

[73] Assignee: Semiconductor Energy Laboratory Co., Ltd., Kanagawa-ken, Japan

[21] Appl. No.: 618,267

[22] Filed: Mar. 18, 1996

[30] Foreign Application Priority Data

Mar. 18, 1995 [JP] Japan .................................. 7-086372
Mar. 21, 1995 [JP] Japan .................................. 7-088789
Mar. 22, 1995 [JP] Japan .................................. 7-088759

[51] Int. Cl.$^6$ ............................ H01L 21/44; H01L 21/00
[52] U.S. Cl. ............................................. 438/30; 438/613
[58] Field of Search ........................... 437/86, 174, 181, 437/40; 148/DIG. 135; 349/187, 45, 60, 122, 153; 438/30, 613

[56] References Cited

U.S. PATENT DOCUMENTS

| | | | |
|---|---|---|---|
| 5,339,180 | 8/1994 | Katoh | 349/46 |
| 5,376,561 | 12/1994 | Vu | 437/31 |
| 5,436,744 | 7/1995 | Arledge | 349/150 |
| 5,596,023 | 1/1997 | Tsubota | 522/100 |

Primary Examiner—John Niebling
Assistant Examiner—Michael S. Lebentritt
Attorney, Agent, or Firm—Fish & Richardson P.C.

[57] ABSTRACT

In a liquid crystal display device, a first substrate includes electrical wirings and a semiconductor integrated circuit which has TFTs and is connected electrically to the electrical wirings, and a second substrate includes a transparent conductive film on a surface thereof. A surface of the first substrate that the electrical wirings are formed is opposite to the transparent conductive film on the second substrate. the semiconductor integrated circuit has substantially the same length as one side of a display screen (i.e., a matrix circuit) of the display device and is obtained by peeling it from another substrate and then forming it on the first substrate. Also, in a liquid crystal display device, a first substrate includes a matrix circuit and a peripheral driver circuit, and a second substrate is opposite to the first substrate, includes a matrix circuit and a peripheral driver circuit and has at least a size corresponding to the matrix circuit and the peripheral driver circuit. Spacers is provided between the first and second substrates. A seal material is formed outside the matrix circuits and the peripheral driver circuits in the first and second substrates. A liquid crystal material is filled inside a region enclosed by the seal material. A protective film is formed on the peripheral driver circuit has substantially a thickness equivalent to an interval between the substrates which is formed by the spacers.

25 Claims, 15 Drawing Sheets

METHOD FOR PRODUCING DISPLAY DEVICE

BACKGROUND OF THE INVENTION

1. Field of the Invention

The present invention relates to a passive matrix type or an active matrix type display device such as a liquid crystal display device and, in particular, to a fashionable display device having a display portion occupying a large area on a substrate obtained by effectively forming a driver semiconductor integrated circuit.

2. Description of the Related Art

Structures of a passive matrix type and an active matrix type have been known as a matrix type display device.

In the passive matrix type, a large number of strip type electrical wirings (row wirings) made of a transparent conductive film or the like are formed on a first substrate along a desired direction. Strip type electrical wirings (column wirings) are formed on a second substrate in a direction substantially perpendicular to the desired direction of the electrical wirings formed on the first substrate. These substrates are arranged so that the electrical wirings formed on both the substrates are opposite to one another.

An electro-optical material such as a liquid crystal material that has a transparent (transmittance) degree and a photoreflective-scattering degree which are changed by a voltage, is formed between the substrates. The transparent degree, the photoreflective-scattering degree and the like in its intersection portion can be selected by applying (supplying) a voltage, a current or the like between a desired row wiring on the first substrate and a desired column wiring on the second substrate. Thus, a matrix display can be performed.

In the active matrix type, row wirings and column wirings are formed on the first substrate using a multilayer wiring (interconnection) technique. Pixel electrodes are formed in those portions where the row wirings and column wirings intersect. An active element such as a thin film transistor (TFT) is formed at each pixel electrode, so that a structure which controls a voltage (potential) or a current with respect to the pixel electrodes is obtained. Also, a transparent conductive film is formed on the second substrate. The first and second substrates are arranged so that the pixel electrodes on the first substrate are opposite to the transparent conductive film on the second substrate.

A substrate is selected in accordance with a production process which will be used. In the passive matrix type, since a complex process is not performed except that a transparent conductive film is formed and then etched to form row and column wiring patterns, a glass substrate and a plastic substrate can be used. On the other hand, in the active matrix type, since a film formation process with relatively high temperature is performed and the prevention of an active ion such as sodium is required, it is necessary to use a glass substrate having an extremely low alkali concentration.

In a conventional matrix type display device, except for a special device, it is necessary to provide the display device with a semiconductor integrated circuit (a peripheral driver circuit or a bar circuit) for driving a matrix circuit. Such a driver circuit is mounted by using tape automated bonding (TAB) or chip on glass (COG). However, since the display device has a large scale matrix with, for example, about several hundred lines, the number of terminals in an integrated circuit is extremely large. Since a driver circuit is constructed by a rectangular-shaped integrated circuit (IC) package and a semiconductor chip, it is necessary to lead wirings in order to connect these terminals to electrical wirings on a substrate. Therefore, an area of peripheral portion cannot be neglected in comparison with a display screen. That is, this peripheral area is relatively large.

To solve the problem, a driver circuit has been formed on a long and narrow substrate (also called a stick or stick crystal) having substantially the same length as a side of a matrix circuit. The driver circuit is then connected to terminals of the matrix circuit. This technique is disclosed in Japanese Patent Application Open No. 7-14880. Since a width of about 2 mm is sufficient for the driver circuit, such arrangement is possible. Thus, an area on the substrate can be used as a display screen.

In this state, when a matrix circuit has a large area, since a circuit cannot be formed on a silicon wafer, it is necessary to form the circuit on a glass substrate or the like. Thus, an active element disposed in the pixel electrode on a semiconductor circuit formed on a glass substrate or the like is a TFT using a crystalline semiconductor or an amorphous semiconductor.

With respect to the stick crystal, a thickness of a substrate for a driver circuit suppress miniaturization of the whole display device. It is possible that a thickness of a substrate is 0.3 mm in order to obtain a thinner display device by optimizing the kind of substrate for the production process. Due to the strength required in a production process, it is difficult to set the thickness of the stick crystal to 0.5 mm or less.

When the material of the stick crystal is different from that of the substrate of the display device, a defect may occur in a circuit by a difference of thermal expansion or the like. In particular, when a plastic substrate is used in the display device, such defects occur often. It is substantially impossible from heat resistance view to use plastic as a substrate for the stick crystal. Since the formed semiconductor integrated circuit is thin, wirings to be connected to the semiconductor integrated circuit one disconnected (broken) at a large step portion of end portions of the semiconductor integrated circuit. Also wiring resistance becomes high, so that a product yield of the whole device and reliability are reduced.

In the passive matrix type liquid crystal display device, a first plurality of strip type electrode wirings made of a transparent conductive film are provided on a first substrate and extended in a first direction. A second plurality of electrode wirings made of a transparent conductive film are provided on a second substrate and extended in a direction substantially perpendicular to the first direction. The first electrode wirings are provided to be opposite to the second electrode wiring through spacers scattered between the first and second substrates. A liquid crystal material is filled between the first and second electrode wirings and sealed by mainly a seal material (member) which is provided in around region that the first substrate is opposite to the second substrate. A peripheral driver circuit, which is connected to the first and second electrode wirings and controls pixels formed by these electrode wirings and the liquid crystal material, is provided outside the region that the first substrate is opposite to the second substrate.

In the passive matrix type liquid crystal display device, a complex process is not performed except that a transparent conductive film is formed on a substrate and then etched to form strip type electrical wirings. In addition, a temperature at which the substrate is to be processed is low. Thus, a glass substrate and a plastic substrate can be used as the first and second substrates.

In an active matrix driver type liquid crystal display device, a first substrate in which an active matrix circuit is provided is disposed to be opposite to a second substrate (an opposite substrate) that has an opposite transparent electrode is provided on the whole surface, through spacers scattered on the first substrate. A liquid crystal material is sealed by mainly a seal material which is provided in periphery of a region that the first substrate is opposite to the second substrate. In the active matrix circuit, pixel electrodes connected to TFTs are disposed in a plurality of matrix forms. Outside the region that the first substrate is opposite to the second substrate, a source driver circuit and a gate driver circuit are provided as a peripheral driver circuit for driving the active matrix circuit.

In a conventional matrix type liquid display device, the peripheral driver circuit is formed by using a semiconductor integrated circuit and mounted by using TAB or COG. However, the number of electrode wirings for constructing a display screen is several hundreds or more. Since a driver circuit is an IC package and a semiconductor chip, it is necessary to lead wirings in order to connect these terminals to electrical wirings on a substrate. Therefore, an area of peripheral portion cannot be neglected in comparison with a display screen.

To solve the above problem, there is a method of forming a semiconductor integrated circuit using TFTs directly on a substrate except in a region where the first substrate is opposite to the second substrate and pixels are formed. Also, there is a method for obtaining the semiconductor integrated circuit by forming directly a driver circuit on a substrate on which a silicon thin film is deposited using an integrated circuit producing technique. In another method, a semiconductor integrated circuit using TFTs is formed on other supporting substrate by using the same technique, and then peeled to adhere it on the first and second substrates, or adhered to the substrate before removing an original supporting substrate.

In a liquid crystal display device having such a structure, it is necessary to provide a protective film made of an organic resin and a silicon nitride system substance in order to prevent the semiconductor integrated circuit from contaminating due to an impurity such as moisture, dust, sodium. However, when such a structure is used, stress due to the protective film acts to the TFTs constructing the semiconductor integrated circuit. Thus, a density of a recombination center of silicon in the TFT is increased and various characteristics such as threshold voltage of the TFT are changed. Also, a characteristic of the TFT constructing the semiconductor integrated circuit is changed by influence due to external pressure applied after the liquid crystal display device is completed.

To solve the above problem, an example of a conventional active matrix type liquid crystal display device is shown in FIG. 12. In FIG. 12, an active matrix circuit 305 including pixel electrodes (not shown), a source driver circuit 303 and a gate driver circuit 304 are provided on a first substrate 301. An opposite (counter) electrode opposite to the pixel electrodes is provided on a whole surface of a second substrate (counter substrate) 302. Spacers (not shown) are scattered on the first substrate 301. Between both electrodes a liquid crystal material 306 is filled and sealed by a seal material 307.

In FIG. 12, not only the active matrix circuit 305 but also the source driver circuit 303 and the gate driver circuit 304 which are a peripheral driver circuit are opposite to the counter substrate to be in contact with the liquid crystal material 306. That is, by the liquid crystal material 306, TFTs constructing the peripheral driver circuit are protected. This structure is disclosed in Japanese Patent Application Open No. 5-66413, for example.

In the liquid crystal display device, spacers which have a spherical shape, a stick shape, an angular shape or the like between the substrates and are made of a hard material such as silica are scattered uniformly, to maintain an interval between two substrates. Each spacer has a diameter corresponding to the same length as an interval between the substrates. The diameter is about 3 $\mu$m to 8 $\mu$m in a display device using a nematic liquid crystal, and 1 $\mu$m to 4 $\mu$m in a display device using a smectic liquid crystal. The number of the spacers is about 50 to 1000 per one pixel in a case wherein a size of one pixel is several 10 $\mu$m square to several 100 $\mu$m square.

In the peripheral driver circuit, a large number of TFTs are provided extremely close to one another. Thus, in the liquid crystal display device of FIG. 12, since the peripheral driver circuit is provided within a liquid crystal region, if external stress is applied to the substrates, the peripheral driver circuit may be broken by the spacers provided between the substrates. Thus, the peripheral driver circuit do not operate regularly, a point defect and a line defect occur and further a display may be impossible, so that reliability and durability of the liquid crystal display device are reduced. Such a phenomenon occurs remarkably in the liquid crystal display device using a plastic substrate which is modifiable by external stress.

SUMMARY OF THE INVENTION

The object of the present invention is to solve the problem with respect to the stick crystal and to obtain a small and light-weight display device.

In the present invention, only a semiconductor integrated circuit equivalent to the stick crystal is connected mechanically and electrically on a substrate of a display device to a thin driver circuit portion. A cross section of the semiconductor integrated circuit portion becomes a tapered shape which is wide in a connection portion to the display device and become narrow as it is apart therefrom. In such a structure, there is no vertical step and disconnection of an electrical wiring does not occur easily. Also, since electrical connection is performed by heating treatment in a lump, thereby to obtain high throughput.

Also, to obtain a small and light-weight liquid crystal display device by providing a peripheral driver circuit for controlling display pixels and electrode wirings in a region in which a liquid crystal is injected, the object of the present invention is to prevent the peripheral driver circuit and TFTs constructing the peripheral driver circuit from breaking due to stress application to the substrates and to improve reliability and durability of the liquid crystal display device.

A basic structure of a display device according to the present invention is as follows. A first substrate includes electrical wirings and a long and narrow semiconductor integrated circuit which has TFTs and is connected electrically to the electrical wirings, and a second substrate includes a transparent conductive film on a surface thereof. A surface of the first substrate on which the electrical wirings are formed is opposite to the transparent conductive film on the second substrate. Thus, as the stick crystal disclosed in Japanese Patent Application Open No. 7-14880, the semiconductor integrated circuit has substantially the same length as one side of a display screen (i.e., a matrix circuit) of the display device and is obtained by peeling it from another substrate and then forming it on the first substrate.

In the passive matrix type, a first substrate includes first electrical wirings of a plurality of transparent conductive films extended to a first direction and a first long and narrow semiconductor integrated circuit having TFTs which is connected to the first electrical wirings and extended in a second direction substantially vertical to the first direction, and a second substrate includes second electrical wirings of a plurality of transparent conductive films extended in the second direction and a second semiconductor integrated circuit having TFTs which connected to the second electrical wirings and extended in first direction. The first and second substrates in the display device are arranged so that the first electrical wirings are opposite to the second electrical wirings. The first and second semiconductor integrated circuits are obtained by peeling them from another substrate and then forming them on the first and second substrates.

In the active matrix type, a first substrate includes a first plurality of electrical wirings extended in a first direction and a first semiconductor integrated circuit having TFTs which is connected to the first electrical wirings and extended in a second direction substantially vertical to the first direction, a second plurality of electrical wirings extended in the second direction, and a second semiconductor integrated circuit having TFTs which is connected to the second electrical wirings and extended to the first direction. A second substrate includes a transparent conductive film on a surface thereof. The first and second substrates in the display device are arranged so that the first and second electrical wirings on the first substrate are opposite to the transparent conductive film on the second substrate. The first and second semiconductor integrated circuits are obtained by peeling them from another substrate and then forming them on the first substrate.

A method for forming a semiconductor integrated circuit having TFTs on a substrate, peeling the formed circuit from the substrate and adhering the peeled circuit on another substrate (or removing the substrate after adhering the circuit on another substrate) has been known as a silicon on insulator (SOI) technique. The technique disclosed in Japanese Patent Application Open No. 6-504139, another known technique or a technique used in an embodiment described below may be used.

FIGS. 1A and 1B show an example of a cross section of a passive matrix type display device. FIG. 1A is a cross section obtained at a relatively low magnification. The left side shows a driver circuit portion 1 formed on a semiconductor integrated circuit, and the left shows a matrix portion 2. A semiconductor integrated circuit 6 having a taper-shaped cross section is fixed mechanically on a substrate 3 by a resin 5. A pattern of an electrical wiring 4 made of a transparent conductive film or the like is formed and at the same time an electrical connection is performed. FIG. 1B is obtained by magnifying a region enclosed by a dot line in FIG. 1A. The semiconductor integrated circuit 6 has a structure that an N-channel type TFT 7 and a P-channel type TFT 8 are disposed between a base insulating film 9, an interlayer insulator 10 and a passivation film 11 of silicon oxide or the like.

With respect to a contact portion of a semiconductor integrated circuit and a wiring electrode, a wiring may be patterned after the semiconductor integrated circuit is fixed on a substrate. As shown in FIG. 3A, a semiconductor integrated circuit 34 having a metal wiring 33 may be fixed on a substrate 40 having an electrical wiring 31 of a transparent conductive film or the like in advance and then electrical connection may be performed. FIGS. 3B and 3C are magnification views of connection portions. The electrical connection is performed by a method for using an anisotropic conductive adhesive 32 in FIG. 3B or a method for crimping the metal wiring 33 in a bump 35 disposed on a wiring electrode 31 in advance in FIG. 3C.

FIGS. 7A and 7B show another example of a cross section of a passive matrix type display device. FIG. 7A is a cross section obtained at a relatively low magnification. The left side shows a driver circuit portion 111 formed on a semiconductor integrated circuit, and the right shows a matrix portion 112. A metal wiring 114 and a semiconductor integrated circuit 116 are fixed mechanically on a substrate 113 by a resin 115.

An overlapping portion of an electrical wiring 122 made of a material such as a transparent conductive film formed on the substrate 113 and the metal wiring 114 is heated by laser irradiation and then melted, to perform electrical connection. At this time, it is desired that the metal wiring 114 is melted easily. Thus, it is preferable to use a metal such as an indium tin oxide (ITO) which has a low melting point.

FIG. 7B is obtained by magnifying a region enclosed by a dot line in FIG. 7A. The semiconductor integrated circuit 116 has a structure that an N-channel type TFT 117 and a P-channel type TFT 118 are disposed between a base insulating film 119, an interlayer insulator 120 and a passivation film 121 of silicon oxide or the like.

With respect to a contact portion of the metal wiring 114 and the wiring electrode 122, in addition to a laser melting method, in FIG. 8A, a semiconductor integrated circuit 134 having a metal wiring 133 may be fixed on a substrate 140 having an electrical wiring 131 of a transparent conductive film or the like by using an anisotropic conductive adhesive 135. Electrical connection then may be performed by heating and crimping. FIGS. 8B and 8C are magnification views of connection portions. In the connection using an anisotropic conductive adhesive 135 (FIG. 8B), the metal wiring 133 is connected electrically to the electrical wiring 131 by using conductive particles 136 in the anisotropic conductive adhesive 135. In FIG. 8C, a method for disposing a bump 137 made of a metal having a low melting point on the wiring electrode 131 in advance and then melting the bump 137 by heating to electrically connect the electrical wiring 131 to the metal wiring 133 can be used.

A schematic order of processes for producing such a passive matrix type display device is shown in FIGS. 2A to 2G. A large number of semiconductor integrated circuits (peripheral driver circuits) 22 are formed on a desired substrate 21. (FIG. 2A)

The substrate 21 having the circuits 22 is divided to obtain stick crystals 23 and 24. Electrical characteristics in the obtained stick crystals are tested before performing the next process to select a good product. (FIG. 2B)

The stick crystals 23 and 24 are adhered on surfaces 26 and 28 of another substrates 25 and 27 in which patterns of wirings made of a transparent conductive film are formed, by the SOI technique, semiconductor integrated circuits 29 and 30 on the stick crystals 23 and 24 are connected electrically to the wirings. (FIGS. 2C and 2D)

The stick crystals 23 and 24 are peeled so as to remain only the semiconductor integrated circuits 29 and 30 on the surfaces 26 and 28 of the substrates 25 and 27. (FIGS. 2E and 2F)

The obtained substrates are opposed to one another, so that a passive matrix type display device is obtained. A surface 26 is a reverse surface of the surface 26, i.e., a surface on which a wiring pattern is not formed. (FIG. 2G)

In the above case, a row stick crystal (a stick crystal for a driver circuit for driving a row wiring) and a column stick crystal (a stick crystal for a driver circuit for driving a column wiring) are divided from the same substrate 21. However, these stick crystals may be divided from another substrate. Although a passive matrix type display device is shown in FIGS. 2A to 2G, the same process may be performed for an active matrix type display device. A case wherein a material such as a film is formed as a substrate is shown in an embodiment.

According to the present invention, there is provided a liquid crystal display device which includes a first substrate in which a passive matrix circuit and a peripheral driver circuit are provided, a second substrate which is provided to be opposite to the first substrate includes a passive matrix circuit and a peripheral driver circuit and has at least a size corresponding to the passive matrix circuit and the peripheral driver circuit, spacers provided between the first and second substrates to maintain a desired substrate interval, a seal material formed outside at least the passive matrix circuits and the peripheral driver circuits in the first and second substrates, and a liquid crystal material filled inside a region enclosed by the seal material, wherein a protective film formed on the peripheral driver circuit has substantially a thickness equivalent to an interval between the substrates which is formed by the spacers.

According to the present invention, there is provided a liquid crystal display device which includes a first substrate in which an active matrix circuit and a peripheral driver circuit are provided, a second substrate which is provided to be opposite to the first substrate and has at least a size corresponding to the active matrix circuit and the peripheral driver circuit, spacers provided between the first and second substrates to maintain a desired substrate interval, a seal material formed outside at least the active matrix circuits and the peripheral driver circuits in the first and second substrates, and a liquid crystal material filled inside a region enclosed by the seal material, wherein a protective film formed on the peripheral driver circuit has substantially a thickness equivalent to an interval between the substrates which is formed by the spacers.

FIG. 13 shows an example of a liquid crystal display device according to the present invention. In FIG. 13, a first substrate 501 made of glass, plastic or the like and a second substrate 502 which is a counter substrate are provided to be opposite to one another. A counter electrode (not shown) is provided inside the second substrate 502.

On the first substrate 501, a large number of electrode wirings made of a transparent conductive film and a peripheral driver circuit 503 connected to the electrode wirings are provided. Also, on the second substrate 502, a large number of electrode wirings made of a transparent conductive film and a peripheral driver circuit 504 connected to the electrode wirings are provided.

In a region outside the electrode wirings made of the transparent conductive film and the peripheral driver circuits 503 and 504 in the first and second substrates 501 and 502, a seal material 507 is provided, and a liquid crystal material 506 which is injected from a liquid crystal inlet (not shown) is filled. A plurality of spacers are provided in a region where the liquid crystal material 506 is injected.

On the peripheral driver circuits 503 and 504, protective films 510 and 511 are provided. A thickness of the protective films 510 and 511 is substantially the same as an interval between the substrates 501 and 502 which is formed by the spacers. Note that numeral 505 represents display pixel electrodes and numeral 509 represents external connection terminals.

FIG. 14 shows across section along a line A—A' in FIG. 13. The protective film 510 is provided on the peripheral driver circuit 503. Also, between the first and second substrates, spacers 401 having a spherical shape are scattered uniformly.

In the present invention, since the protective film 110 provided on the peripheral driver circuit 503 in the substrate 501 has a thickness substantially equivalent to an interval between the substrates which is formed by the spacers, a concentration of local stress due to external stress 402 can be suppressed and breaking of the peripheral driver circuit 103 can be prevented.

A schematic order of processes for producing such a display device is shown in FIGS. 2A to 2G, as described above. In this case, the stick crystals (stick substrates) 23 and 24 in which peripheral driver circuits are formed are obtained by cutting the same substrate 21. However, these stick crystals may be obtained by different substrates. Although a passive matrix type display device is shown in FIGS. 2A to 2G, the same process may be performed for an active matrix type display device. Further, since a driver circuit is formed on another substrate and then adhered, a material such as a plastic film can be used as a substrate.

According to the present invention, in a liquid crystal display device, a matrix circuit and a peripheral driver circuit are provided in a liquid crystal region, and a protective film having a thickness substantially equivalent to a size of the spacers scattered in the liquid crystal region is provided on the peripheral driver circuit, so that breaking of TFTs constructing the peripheral driver circuit due to stress application to the substrates can be prevented and an interval between the substrates can be maintained to be constant. Thus, reliability and durability of the liquid crystal display device can be improved.

DETAILED DESCRIPTION OF THE PREFERRED EMBODIMENTS

[Embodiment 1]

Figure 1A:
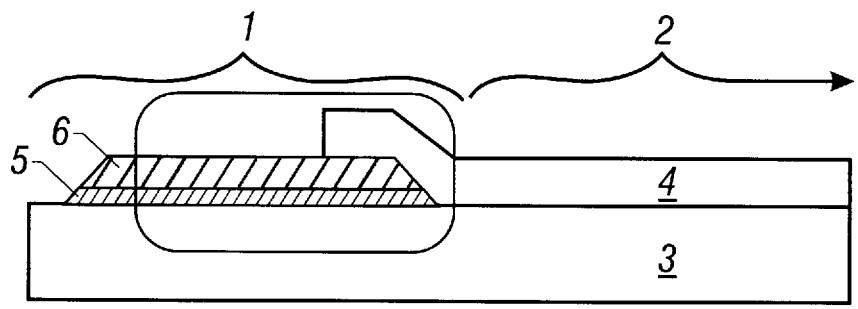
FIGS. 1A and 1B show a cross section structure according to the present invention.
Figure 1B:
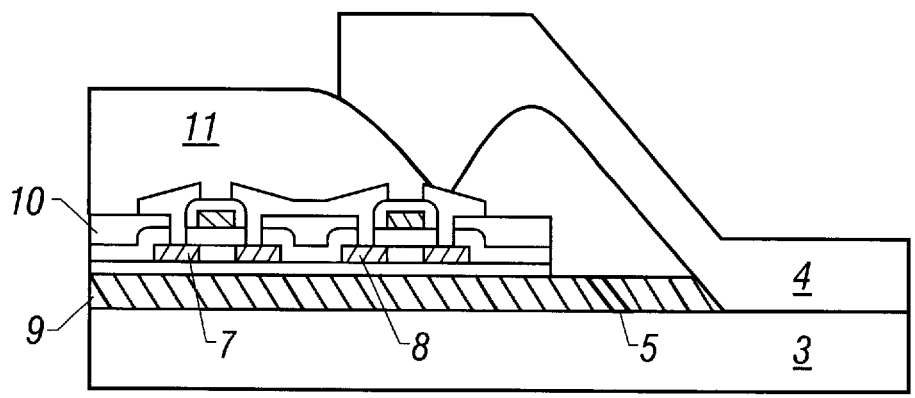
Figure 2A:
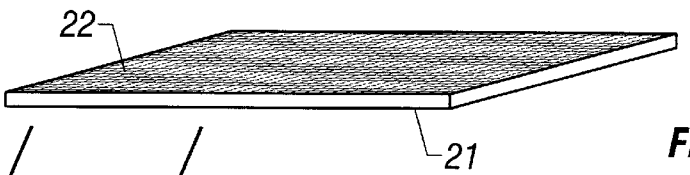
FIGS. 2A to 2G show a producing method of a display device of the present invention.
Figure 2B:
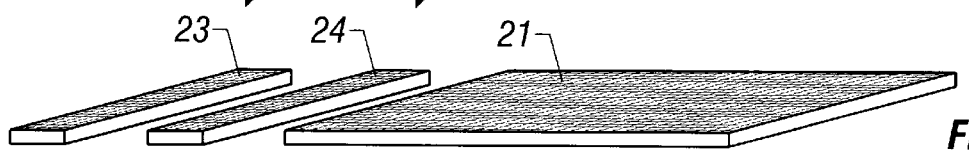
Figure 2C:
Figure 2D:
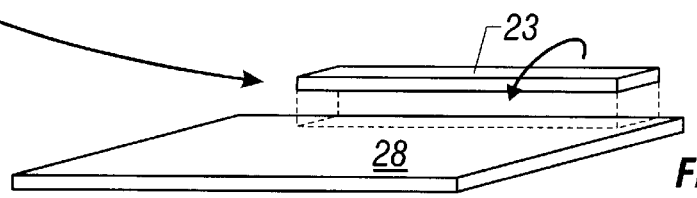
Figure 2E:
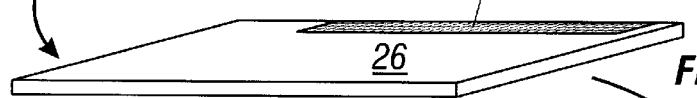
Figure 2F:
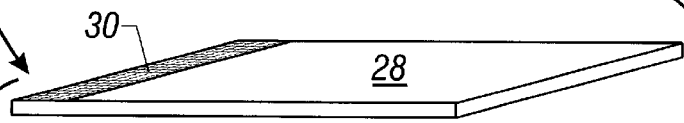
Figure 2G:
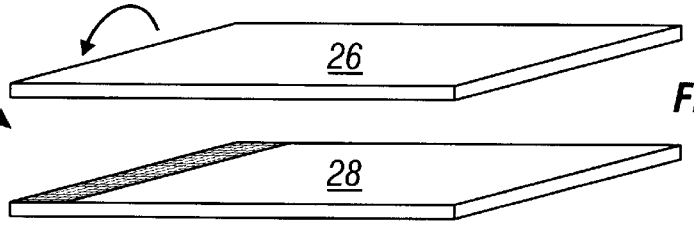
Figure 3A:
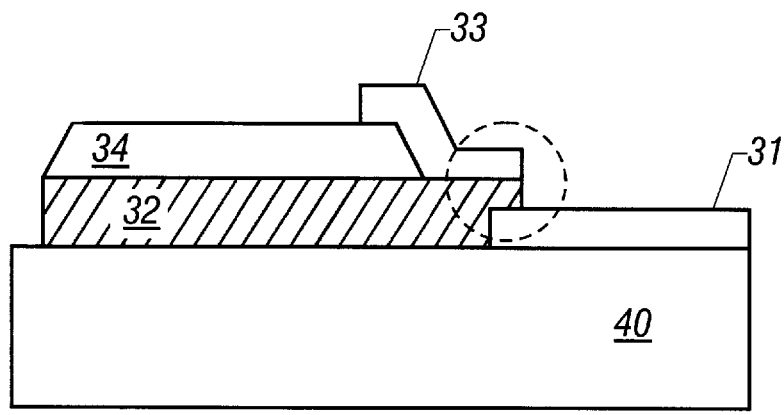
FIGS. 3A to 3C show an example of a cross section structure of a display device of the present invention.
Figure 3B:
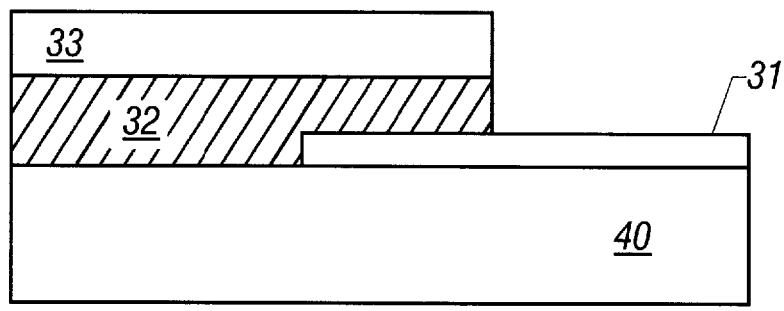
Figure 3C:
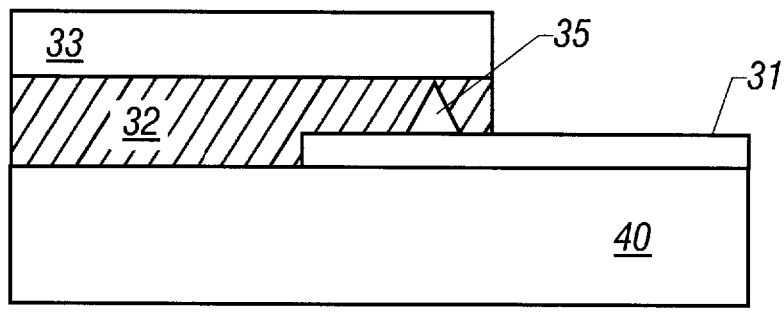
Figure 4A:
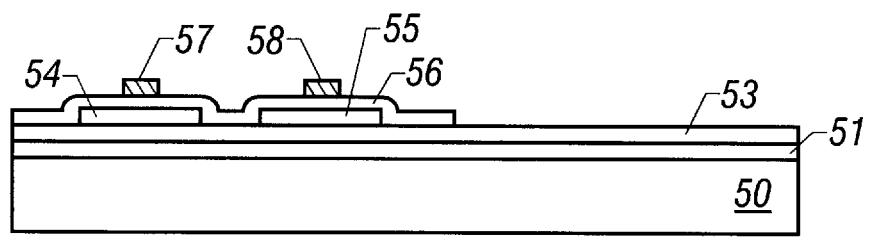
FIGS. 4A to 4C show an example of a producing process of a semiconductor integrated circuit used in the present invention.

The embodiment shows a schematic producing process for one substrate in a passive matrix type liquid crystal display device, using FIGS. 4A to 5D. FIGS. 4A to 4C show a schematic process for forming a driver circuit on a stick crystal, and FIGS. 5A to 5D show a schematic process for forming the driver circuit on a substrate in a liquid crystal display device.

A silicon film having a thickness of 3000 Å is deposited as a peeling layer 51 on a glass substrate 50. Since this silicon film is etched when a circuit formed thereon is peeled from the substrate, there is almost no problem with respect to film quality, so that the silicon film may be deposited by a method making mass-production possible. The silicon film may be amorphous or crystalline and include another element.

As the glass substrate, a glass (containing no alkali or alkali at a low concentration) or a quartz glass such as Corning 7059, Corning 1737, NH technoglass NA 45, NH technoglass NA 35 or Japan electric glass OA2 may be used. When a quartz glass is used, there is a problem in its cost. However, since, in the present invention, an area used in one liquid crystal display device is extremely small, a cost per unit is sufficiently low.

A silicon oxide film 53 having a thickness of 200 nm is deposited on the peeling layer 51. Since the silicon oxide film 53 is used as a base film, it is necessary to pay sufficient attention to its formation. By a known method, crystalline island silicon regions (silicon islands) 54 and 55 are formed. A thickness of these silicon islands 54 and 55 influence characteristics of a necessary semiconductor circuit. In general, it is preferable to use a thin film. In one embodiment, the thickness is 40 to 60 nm.

To obtain crystalline silicon, a method for irradiating an intense light such as a laser into amorphous silicon (a laser annealing method) or a method for making solid phase growth (crystallization) by thermal annealing (a solid phase growth (crystallization) method) is used. In using the solid phase growth method, as disclosed in Japanese Patent Application Open No. 6-244104, when a catalytic element such as nickel is added to silicon, a crystallization temperature can be reduced and an annealing time can be shortened. Also, as disclosed in Japanese Patent application Open No. 6-318701, silicon crystallized by the solid phase growth method may be laser-annealed. A method to be used may be determined in accordance with characteristics of a necessary semiconductor integrated circuit, a heat-resistance temperature of a substrate and the like.

By plasma chemical vapor deposition (plasma CVD) or thermal CVD, a silicon oxide having a thickness of 120 nm is deposited as a gate insulating film 56, and then gate electrode-wirings 57 and 58 using crystalline silicon having a thickness of 500 nm are formed. The gate electrode-wirings may be a metal such as aluminum, tungsten or titanium, or silicide thereof. When metal gate electrode-wirings 57 and 58 are formed, as disclosed in Japanese Patent Application No. 5-267667 or 6-338612, an upper or a side surface of the gate electrode-wirings may be coated with an anodic oxide. A material constructing the gate electrode-wirings 57 and 58 may be determined in accordance with characteristics of a necessary semiconductor circuit, a heat-resistance temperature of a substrate and the like. (FIG. 4A)

Figure 4B:
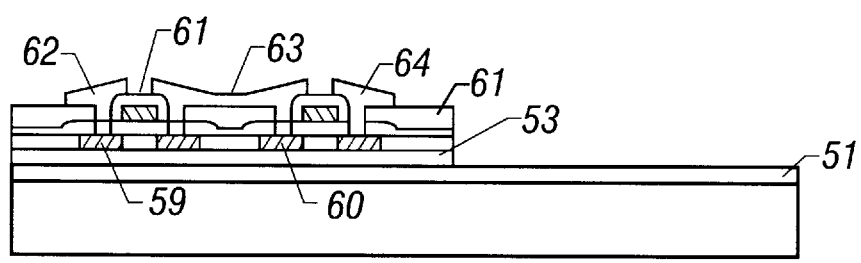

In a self-alignment, an N-type and a P-type impurities are introduced into the silicon islands 54 and 55 by ion doping or the like, to form N-type regions, 59 and P-type regions 60. An interlayer insulator 61 (a silicon oxide film having a thickness of 500 nm) is deposited by a known method, and then contact holes are formed therein, to form aluminum alloy wirings 62 to 64. (FIG. 4B)

Figure 4C:
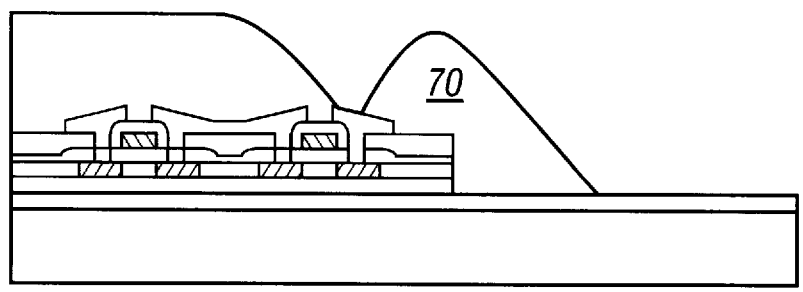

A polyimide film 70 is formed as a passivation film on those films by adding varnish and then curing it. In the embodiment, Photoneath UR-3800™ of Toray Industries Inc. is used. Addition is performed by a spinner (not shown). An addition condition may be determined in accordance with a desired film thickness. The polyimide film 70 having a thickness of about 4 µm is formed at 3000 rmp for 30 seconds. After drying, exposure and development are performed. By selecting a desired condition, a desired taper shape can be obtained. The film is then cured by processing at 300° C. in an atmosphere containing nitrogen. (FIG. 4C)

Figure 5A:
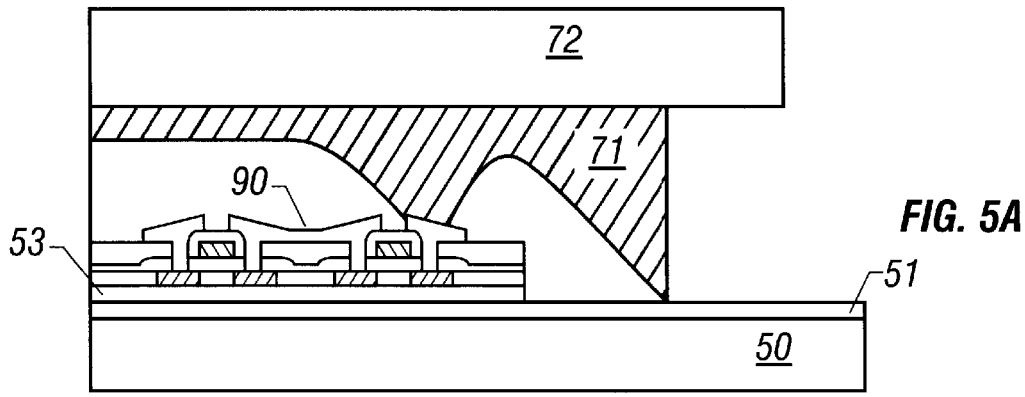
FIGS. 5A to 5D show a process for adhering a semiconductor integrated circuit to a substrate of a display device.

A transfer substrate 72 is adhered to the semiconductor integrated circuit by a resin 71. It is desired that the transfer substrate 72 has a strength and a flat surface to hold the integrated circuit impermanently. Thus, glass, plastic or the like can be used. Since the transfer substrate 72 is peeled later, it is preferable that the resin 71 is a removable material. Also, as the resin 71, a removable material such as an adhesive may be used. (FIG. 5A)

Figure 5B:
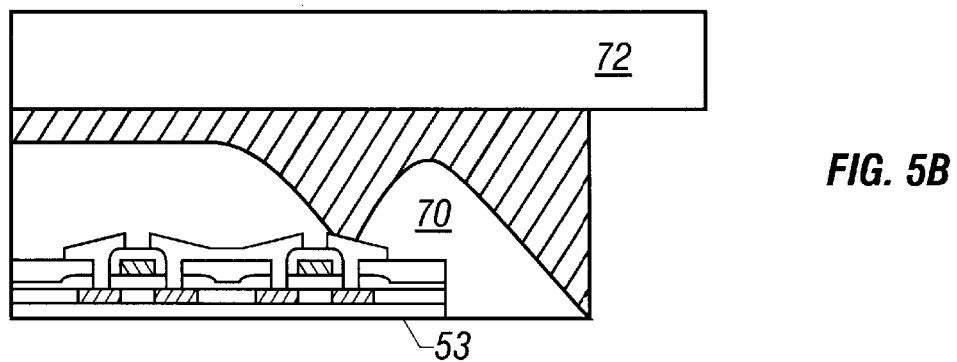

The processed substrate is left within air flow of a mixture gas of fluorine trichloride ($ClF_3$) and nitrogen. A flow rate of fluorine trichloride and nitrogen is set to 500 sccm. A reaction process is 1 to 10 Torr. A temperature is a room temperature. It has been known that fluorine halide such as fluorine trichloride has a characteristic for selectively etching silicon. On the other hand, silicon oxide is not almost etched. Thus, the peeling layer made of silicon is etched in accordance with an elapse. However, the base film 53 made of silicon oxide is not almost etched, so that a TFT element is not damaged. Later the peeling layer 51 is etched completely, thereby to peel the semiconductor integrated circuit completely. (FIG. 5B)

Figure 5C:
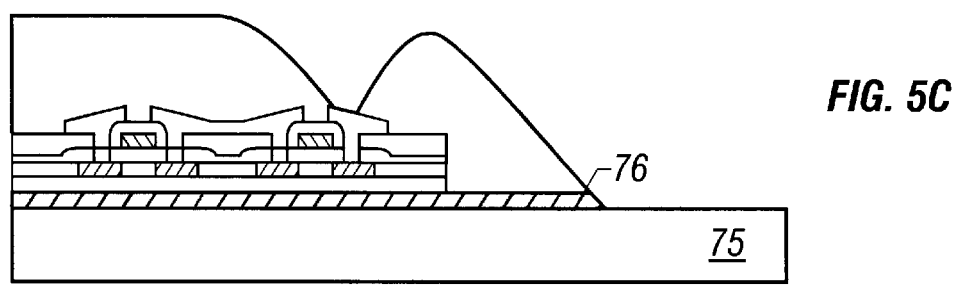

The peeled semiconductor integrated circuit is adhered to a substrate 75 of a liquid crystal display device by a resin 76 and then the transfer substrate 72 is removed. (FIG. 5C)

Thus, a transfer of the semiconductor integrated circuit to the substrate 75 of the liquid crystal display device is completed. The substrate of the liquid crystal display device is polyether sulfate (PES) having a thickness of 0.3 mm.

Figure 5D:
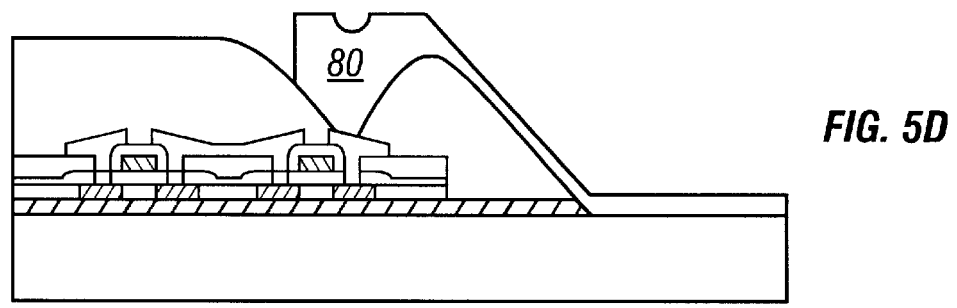

By sputtering, an indium tin oxide (ITO) film 80 having a thickness of 100 nm is formed. The ITO film is a transparent conductive oxide and patterned to complete electrical connection between the electrical wirings and the semiconductor integrated circuit. (FIG. 5D)

As a result, the formation of the semiconductor integrated circuit on one substrate of the liquid crystal display device is completed. The liquid crystal display device is completed by using the obtained substrate.

[Embodiment 2]

The embodiment shows a schematic process for producing a semiconductor integrated circuit on a stick crystal. The embodiment will be explained using FIGS. 6A and 6B.

Figure 6A:
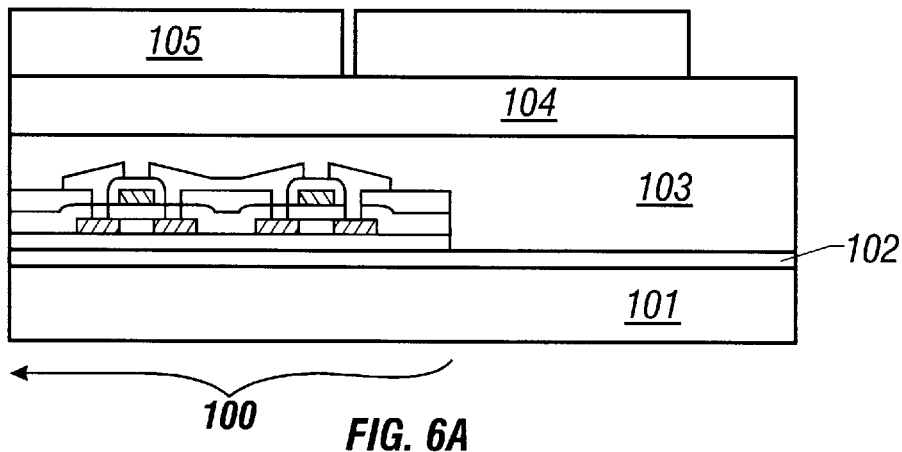
FIGS. 6A and 6B show an example of a producing process of a semiconductor integrated circuit used in the present invention.

In FIG. 6A, a peeling layer 102 made of silicon is formed on a substrate 101, and then a driver circuit (a semiconductor integrated circuit) 100 having TFTs is formed on the peeling layer 102. These are formed by the same process as in Embodiment 1. A silicon oxide film is formed as a passivation film. In the embodiment, two-layer silicon oxide films 103 and 104 are formed by plasma CVD. The first silicon oxide film 103 is formed by applying a relatively high power, and the second silicon oxide film 104 is formed by a relatively low power. A thickness of the first silicon oxide film 103 is 100 to 500 nm, and a thickness of the second silicon oxide film 104 is 500 to 1000 nm.

Figure 6B:
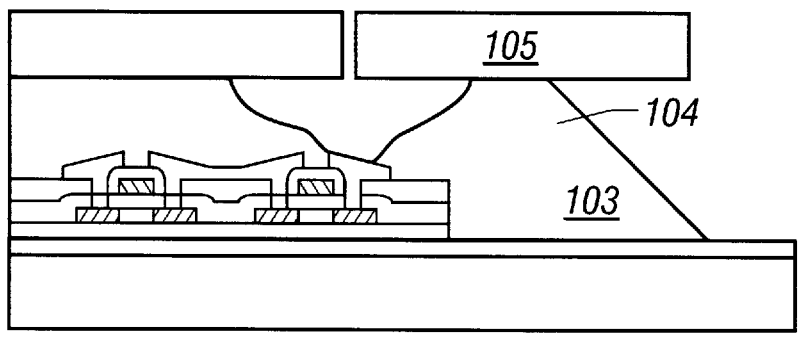
Figure 7A:
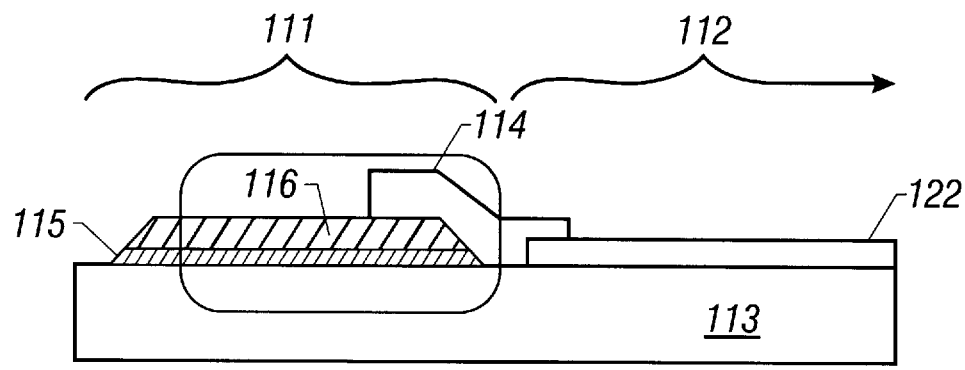
FIGS. 7A and 7B show another example of a cross section structure of a display device of the present invention.
Figure 7B:
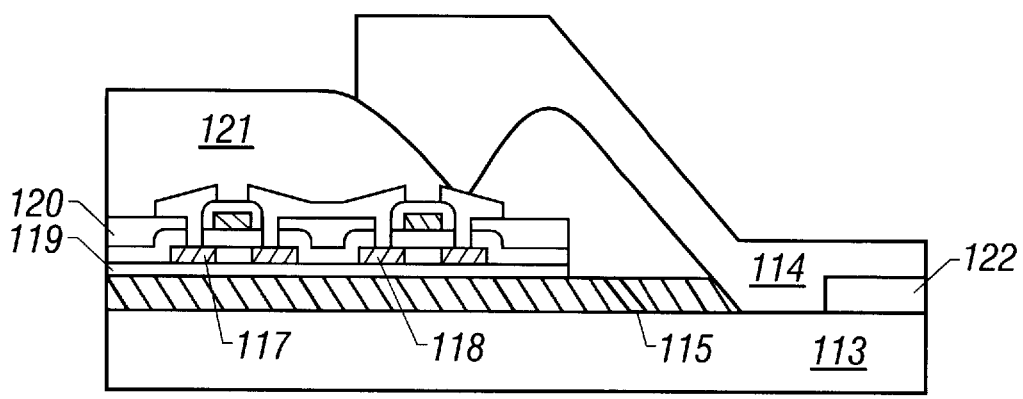
Figure 8A:
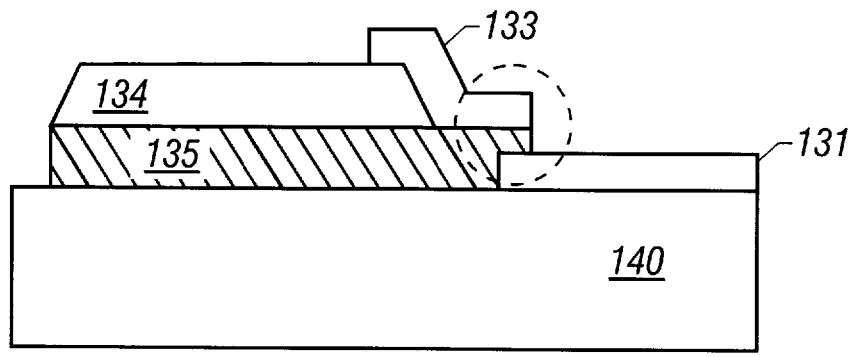
FIGS. 8A to 8C show a cross section structure according to the present invention.
Figure 8B:
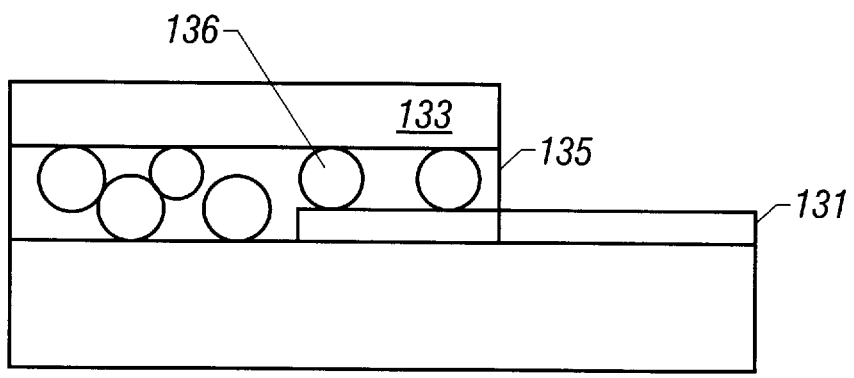
Figure 8C:
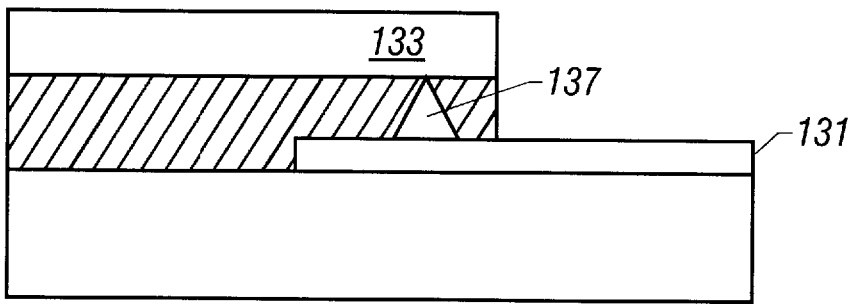

After a resist 105 for patterning is formed, the substrate having a laminate is immersed in a 1/10 hydrofluoric acid solution to etch the silicon oxide films 103 and 104. At this time, an etching rate of the first silicon oxide film 103 formed by applying the relatively high power is lower than at of the second silicon oxide film 104 formed by applying the relatively low power. As a result, the second silicon oxide film 104 is undercut greatly. (FIG. 6B)

Finally, by peeling the resist, a semiconductor integrated circuit having a taper-shaped cross section is completed.

In the embodiment, the two-layer silicon oxide films 103 and 104 for a passivation film are used. Three-layers or more may be used. Also, by changing a film formation condition successively, a film may be used so that an etching rate becomes large in a direction from a lower layer to an upper layer. Further, a material such as silicon nitride having the same effect or a combination thereof can be used.

In the embodiment, since periphery of end portions of the insulating film 70 covering the semiconductor integrated circuit 100 has a taper shape, disconnection of a formed wiring in a step portion can be prevented. Also, a product yield and reliability can be improved.

[Embodiment 3]

Figure 9A:
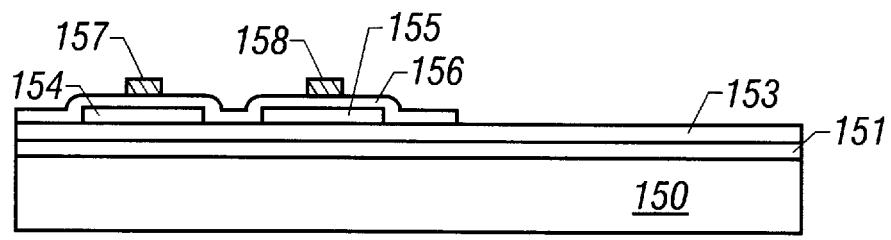
FIGS. 9A to 9C show another example of a producing process of a semiconductor integrated circuit used in the present invention.

The embodiment shows a schematic producing process for one substrate in a passive matrix type liquid crystal display device, using FIGS. 9A to 10D. FIGS. 9A to 9C show a schematic process for forming a driver circuit on a stick crystal, and FIGS. 10A to 10D show a schematic process for forming the driver circuit on a substrate in a liquid crystal display device.

A silicon film having a thickness of 3000 Å is deposited as a peeling layer 151 on a glass substrate 150. Since this silicon film is etched when a circuit formed thereon is peeled from the substrate, there is almost no problem with respect to film quality, so that the silicon film may be deposited by a method that mass-production is possible. Also, the silicon film used as the peeling layer 151 may be amorphous or crystalline and include another element.

As the glass substrate 150, a glass (containing no alkali or alkali at a low concentration) or a quartz glass such as Corning 7059™, Corning 1737™, NH technoglass NA 45™, NH technoglass NA 35™ or Japan electric glass OA2™ may be used. When a quartz glass is used, there is a problem in its cost. However, since, in the present invention, an area used in one liquid crystal display device is extremely small, a cost per unit is sufficiently low.

A silicon oxide film 153 having a thickness of 200 nm is deposited on the peeling layer 151. Since the silicon oxide film 153 is used as a base film, it is necessary to pay sufficient attention to its formation. By a known method, crystalline island silicon regions (silicon islands) 154 and 155 are formed. A thickness of the silicon islands 154 and 155 influence characteristics of a necessary semiconductor circuit. In general, it is preferable to be a thin film. In the embodiment, the thickness is 40 to 60 nm.

To obtain crystalline silicon, a method for irradiating an intense light such as a laser into amorphous silicon (a laser annealing method) or a method for making solid phase growth (crystallization) by thermal annealing (a solid phase growth (crystallization) method) is used. In using the solid phase growth method, as disclosed in Japanese Patent Application Open No. 6-244104, when a catalytic element such as nickel is added to silicon, a crystallization temperature can be reduced and an annealing time can be shortened. Also, as disclosed in Japanese Patent application Open No. 6-318701, silicon crystallized by the solid phase growth method may be laser-annealed. A method to be used may be determined in accordance with characteristics of a necessary semiconductor integrated circuit, a heat-resistance temperature of a substrate and the like.

By plasma CVD or thermal CVD, a silicon oxide having a thickness of 120 nm is deposited as a gate insulating film 156, and then gate electrode-wirings 157 and 158 using crystalline silicon having a thickness of 500 nm are formed. The gate electrode-wirings 157 and 158 Hay be a metal such as aluminum, tungsten or titanium, or silicide thereof. When metal gate electrode-wirings are formed, as disclosed in Japanese Patent Application No. 5-267667 or 6-338612, an upper or a side surface of the gate electrode-wirings may be coated with an anodic oxide. A material constructing the gate electrode-wirings 157 and 158 may be determined in accordance with characteristics of a necessary semiconductor circuit, a heat-resistance temperature of a substrate and the like. (FIG. 9A)

Figure 9B:
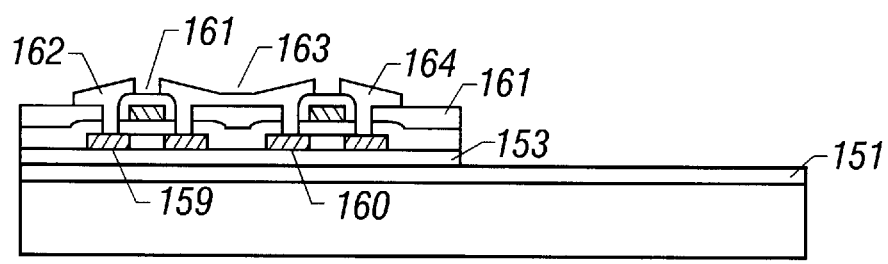

In a self-alignment, an N-type and a P-type impurities are introduced into the silicon islands 154 and 155 by ion doping or the like, to form N-type regions 159 and P-type regions 160 in the silicon islands 154 and 155. An interlayer insulator 161 (a silicon oxide film having a thickness of 500 nm) is deposited by a known method, and then contact holes are formed therein, to form aluminum alloy wirings 162 to 164. (FIG. 9B)

Figure 9C:
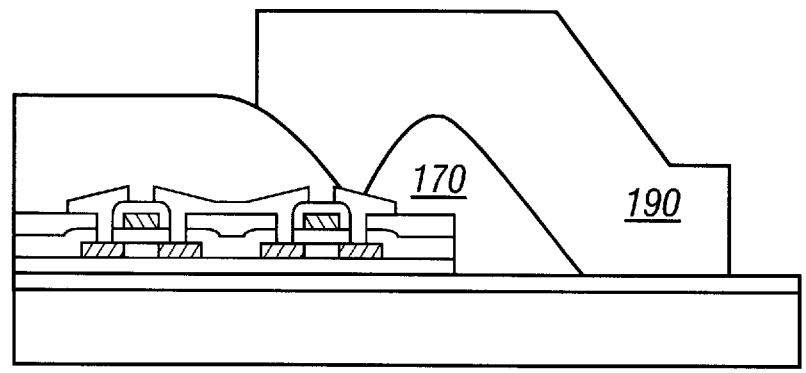

A polyimide film 170 is formed as a passivation film by adding varnish and then curing it. In the embodiment, Photoneath UR-3800™ of Toray Industries Inc. is used. Addition is performed by a spinner (not shown). An addition condition may be determined in accordance with a desired film thickness. The polyimide film 170 having a thickness of about 4 $\mu$m is formed at 3000 rpm for 30 seconds. After drying, exposure and development are performed. By selecting a desired condition, a desired pattern can be obtained. Then, the film is cured by processing at 300° C. in an atmosphere containing nitrogen. A metal wiring 190 of aluminum is formed thereon by sputtering. (FIG. 9C)

Figure 10A:
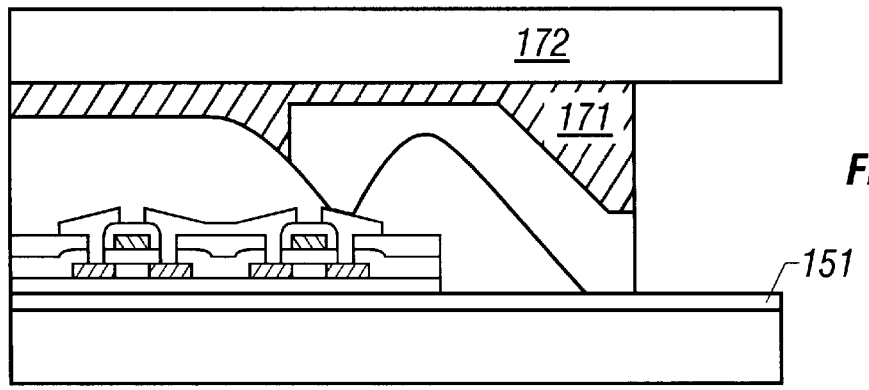
FIGS. 10A to 10D a process for adhering a semiconductor integrated circuit to a substrate of a display device.

A transfer substrate 172 is adhered to the semiconductor integrated circuit by a resin 171. It is desired that the transfer substrate 172 has a strength and a flat surface to hold the integrated circuit impermanently. Thus, glass, plastic or the like can be used. Since the transfer substrate 172 is peeled later, it is preferable that the resin 71 is a removable material. Also, as the resin 71, a removable material such as an adhesive may be used. (FIG. 10A)

Figure 10B:
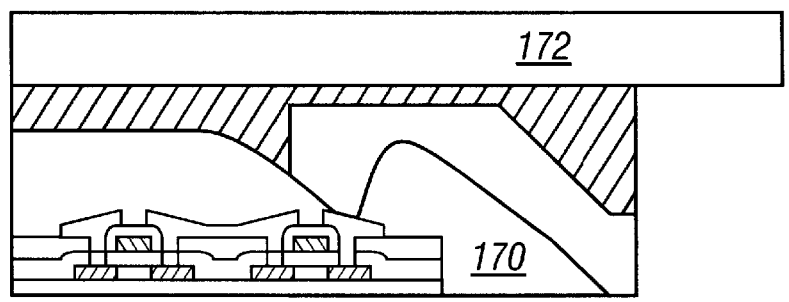

The processed substrate is left in air flow of a mixture gas of fluorine trichloride (ClF$_3$) and nitrogen. A flow rate of fluorine trichloride and nitrogen is 500 sccm. A reaction process is 1 to 10 Torr. A temperature is a room temperature. It has been known that fluorine halide such as fluorine trichloride has a characteristic for selectively etching silicon. Silicon oxide is not almost etched. Thus, the peeling layer 151 made of silicon is etched in accordance with an elapse. Since the base film 153 made of silicon oxide is not almost etched, a TFT element is not damaged. Later, the peeling layer 151 is etched completely, thereby to peel the semiconductor integrated circuit completely. (FIG. 10B)

Figure 10C:
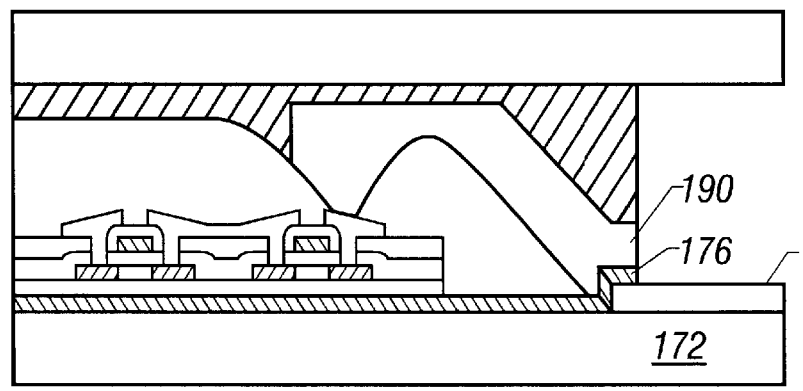

The peeled semiconductor integrated circuit is adhered to a substrate 175 of a liquid crystal display device by a resin 176 and then the transfer substrate 172 is removed. (FIG. 10C)

Thus, a transfer of the semiconductor integrated circuit to the substrate of the liquid crystal display device is completed. The substrate of the liquid crystal display device is polyether sulfate (PES) having a thickness of 0.3 mm.

Figure 10D:
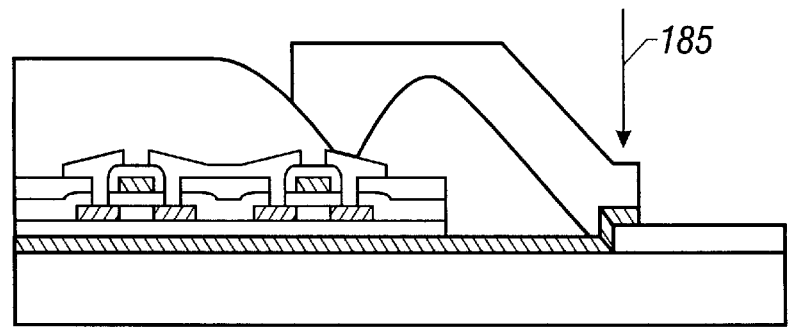

An overlapping portion of a wiring electrode 180 and the metal wiring 190 which are formed on the substrate of the liquid crystal display device is irradiated with a YAG laser 185 and then heated, to perform electrical connection. (FIG. 10D)

As a result, the formation of the semiconductor integrated circuit on one substrate of the liquid crystal display device is completed. The liquid crystal display device is completed by using the obtained substrate.

[Embodiment 4]

Figure 11A:
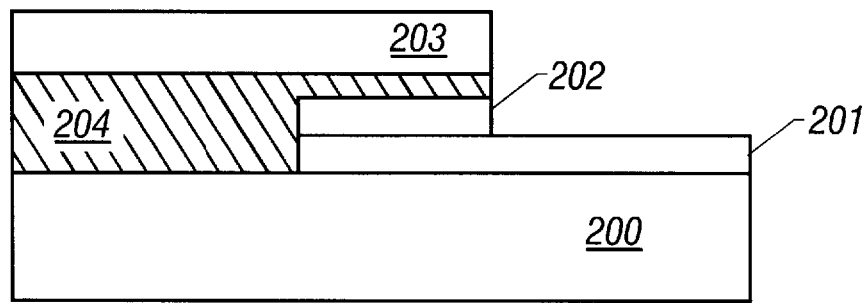
FIGS. 11A and 11B show an example of a process of electrical connection of a wiring in the present invention.
Figure 11B:
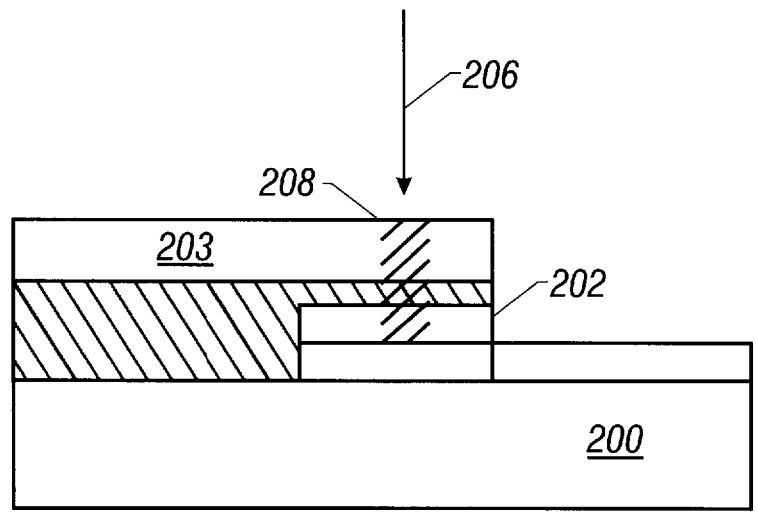
Figure 12:
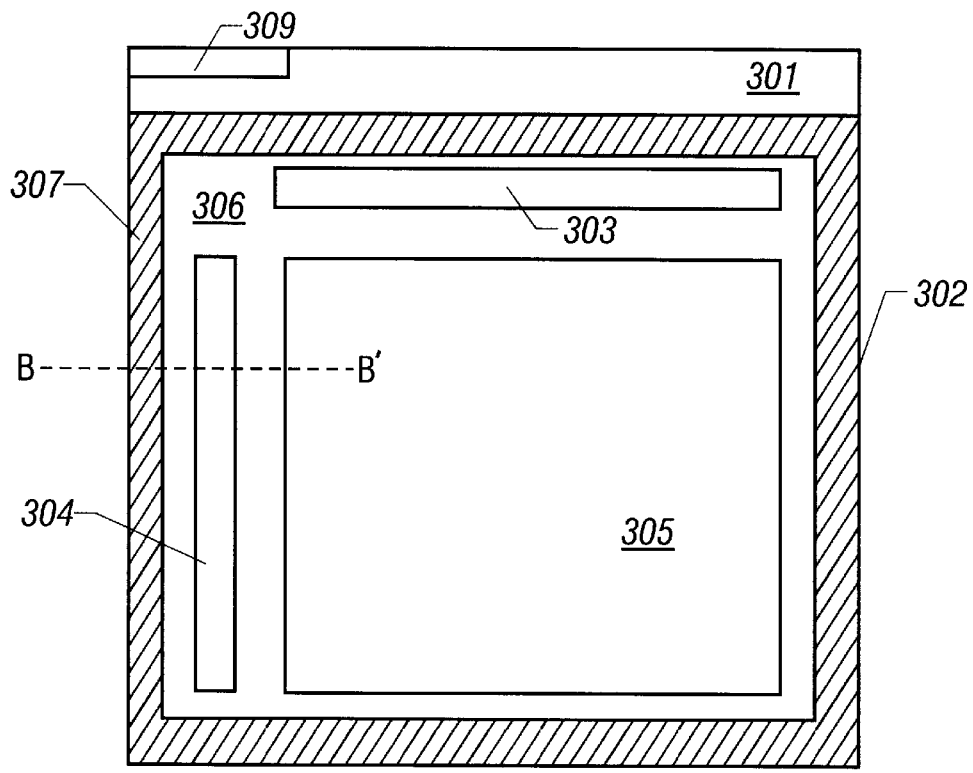
FIG. 12 shows a conventional liquid crystal display device.
Figure 13:
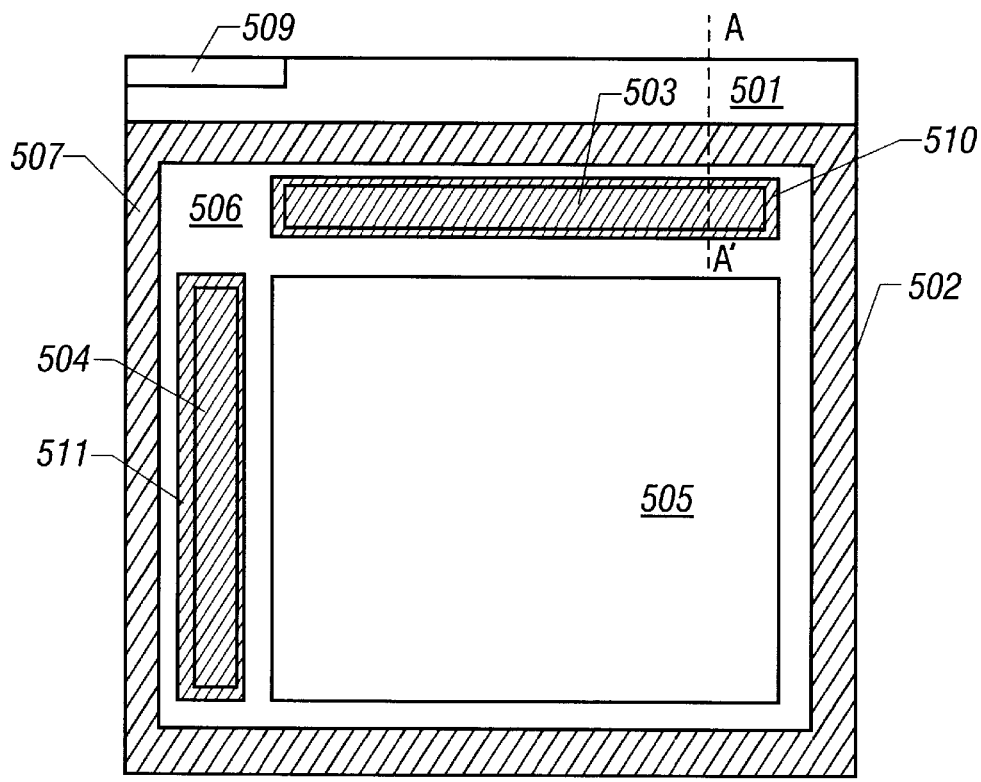
FIG. 13 shows a liquid crystal display device according to the present invention.
Figure 14:
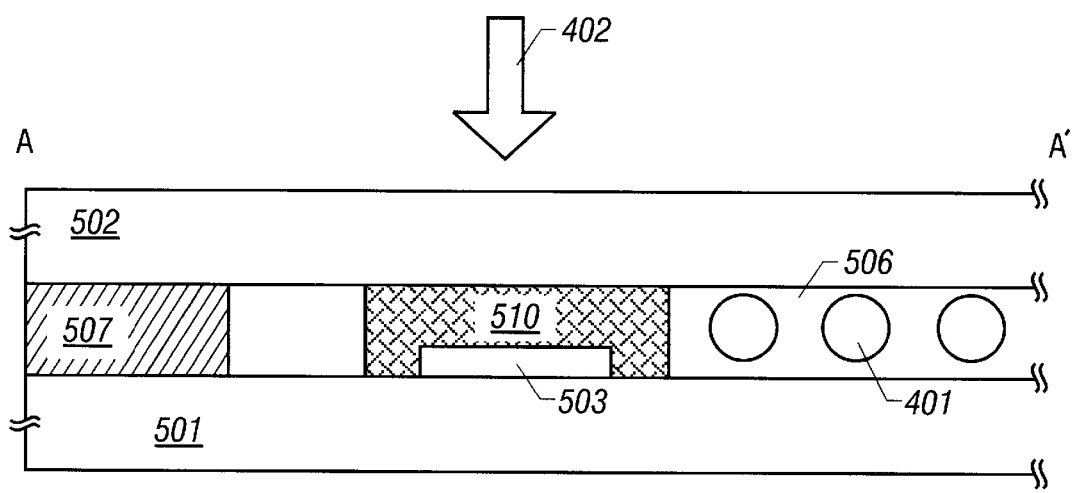
FIG. 14 is a cross section view in a line A—A' of FIG. 13.

The embodiment shows a schematic process for electrically connecting a wiring on a substrate of a liquid crystal display device to a metal wiring in a semiconductor integrated circuit using FIGS. 11A and 11B. FIGS. 11A and 11B are magnification views of a connection portion of a wiring electrode on a substrate of a liquid crystal display device and a metal wiring of a semiconductor integrated circuit.

A wiring electrode 201 made of a transparent conductive film is formed on a substrate 200 of a liquid crystal display device by sputtering. Further, a pad 202 made of a metal having a low melting point is formed in a portion to be electrically connected to a semiconductor integrated circuit by sputtering.

Using the method as described in Embodiment 1, a semiconductor integrated circuit and a metal wiring which are formed on another substrate 203 are fixed mechanically through an adhesive 204. (FIG. 11A)

An overlapping portion of the metal wiring on another substrate 203 and the pad 202 is melted by a YAG laser 206, to complete an electrical connection 208. (FIG. 11B)

In the embodiment, a laser is irradiated from a position over the metal wiring of another substrate 203. In a case wherein a laser is irradiated from a position under the substrate 200, the same effect is also obtained.

[Embodiment 5]

Figure 15A:
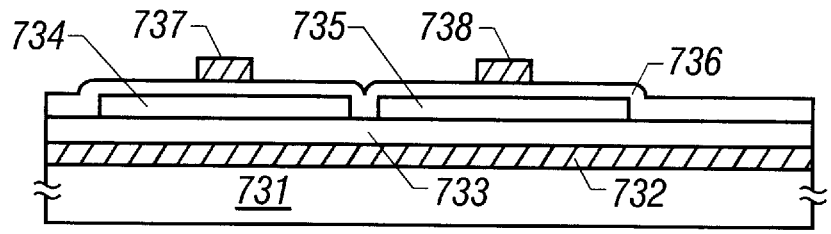
FIGS. 15A to 15C show a producing process of a stick substrate used in the present invention.

The embodiment shows a schematic producing process for one substrate in a passive matrix type liquid crystal display device, using FIGS. 15A to 16D. FIGS. 15A to 15C show a schematic process for forming a peripheral driver circuit on a stick substrate, and FIGS. 16A to 16D show a schematic process for forming the peripheral driver circuit on a substrate in a liquid crystal display device.

A silicon film having a thickness of 3000 Å is deposited as a peeling layer 732 on a glass substrate 731. Since this silicon film is etched when a circuit formed thereon is peeled from the substrate, there is no problem almost with respect to a film quality, so that the silicon film may be deposited by a method making mass production possible. The silicon film may be amorphous or crystalline.

As the glass substrate 731, a glass (containing no alkali or alkali at a low concentration) or a quartz glass such as Corning 7059, Corning 1737, NH technoglass NA 45, NH technoglass NA 35 or Japan electric glass OA2 may be used. When a quartz glass is used, there is a problem in its cost. However, since, in the present invention, an area used in one liquid crystal display device is extremely small, a cost per unit is sufficiently low.

A silicon oxide film 733 having a thickness of 5000 Å is deposited on the peeling layer 732. Since the silicon oxide film 733 is used as a base film, it is necessary to pay sufficient attention to its formation. By a known method, crystalline island silicon regions (silicon islands) 734 and 735 are formed. A thickness of these silicon islands 734 and 735 influence characteristics of a necessary semiconductor circuit. In general, it is preferable to be a thin film. In the embodiment, the thickness is 400 to 600 Å.

To obtain crystalline silicon, a method for irradiating an intense light such as a laser into amorphous silicon (a laser annealing method) or a method for making solid phase growth (crystallization) by thermal annealing (a solid phase growth (crystallization) method) is used. In using the solid phase growth method, as disclosed in Japanese Patent Application Open No. 6-244104, when a catalytic element such as nickel is added to silicon, a crystallization temperature can be reduced and an annealing time can be shortened. Also, as disclosed in Japanese Patent application Open No. 6-318701, silicon crystallized by the solid phase growth method may be laser-annealed. A method to be used may be determined in accordance with characteristics of a necessary semiconductor integrated circuit, a heat-resistance temperature of a substrate and the like.

By plasma CVD or thermal CVD, a silicon oxide having a thickness of 1200 Å is deposited as a gate insulating film 736, and then gate electrode-wirings 737 and 738 using crystalline silicon having a thickness of 5000 Å are formed. The gate electrode-wirings may be a metal such as aluminum, tungsten or titanium, or silicide thereof. When metal gate electrode-wirings are formed, as disclosed in Japanese Patent Application No. 5-267667 or 6-338612, an upper or a side surface of the gate electrode-wirings may be coated with an anodic oxide. A material constructing the gate electrode-wirings 737 and 738 may be determined in accordance with characteristics of a necessary semiconductor circuit, a heat-resistance temperature of a substrate and the like. (FIG. 15A)

Figure 15B:
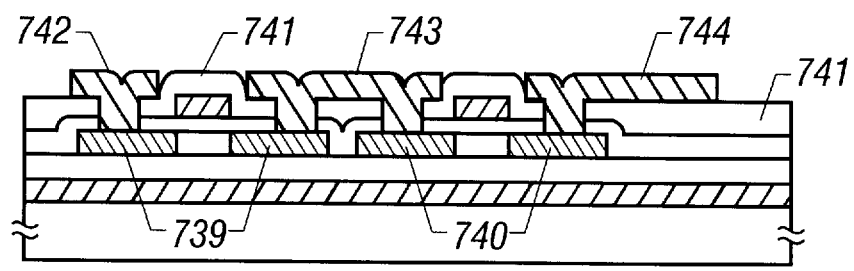

In a self-alignment, an N-type and a P-type impurities are introduced into the silicon islands 134 and 135 by ion doping or the like, to form N-type regions 739 and P-type regions 740. An interlayer insulator 741 (a silicon oxide film having a thickness of 5000 Å) is deposited by a known method, and then contact holes are formed therein, to form aluminum alloy wirings 742 to 744. (FIG. 15B)

Figure 15C:
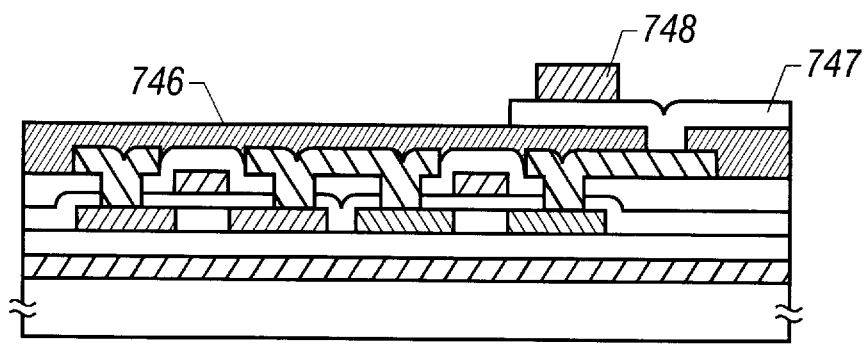

A silicon nitride film 746 having a thickness of 2000 Å is deposited as a passivation film by plasma CVD, and then a contact hole for the wiring 744 of an output terminal is formed therein. By sputtering, an electrode 747 made of an ITO film having a thickness of 1000 Å is formed. The ITO film is a transparent conductive oxide. Then, a bump 748 made of gold having a diameter of about 50 $\mu$m and a height of about 30 $\mu$m is formed mechanically on the ITO electrode 747. The obtained circuit is divided to obtain stick substrates each having a desired size. (FIG. 15C)

Figure 16A:
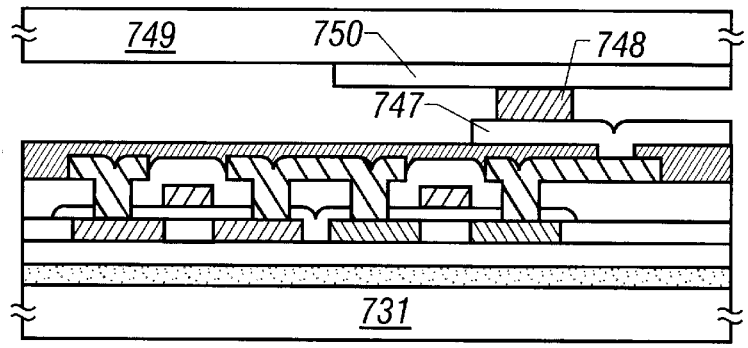
FIGS. 16A to 16D show a process for adhering a peripheral driver circuit on the stick substrate to another substrate in the present invention.

On the other hand, as shown in FIGS. 16A, an ITO electrode 750 having a thickness of 1000 Å is formed on a substrate 749 used in a liquid crystal display device. In the embodiment, the substrate in the liquid crystal display device is polyether sulfate (PES) having a thickness of 0.3 mm. Stress (pressure) is applied to the substrate 749 and the stick substrate 731 to adhere to these substrates one another. At this time, the ITO electrode 747 is connected electrically to the ITO electrode 750 through the bump 748. (FIG. 16A)

An adhesive 751 which is mixed with a thermally curable organic resin is injected into a gap between the stick substrate 731 and the substrate 749 in the liquid crystal display device. The adhesive 751 may be applied to a surface of one of the substrates in advance before the stick substrate 731 is crimped to the substrate 749 in the liquid crystal display device.

Figure 16B:
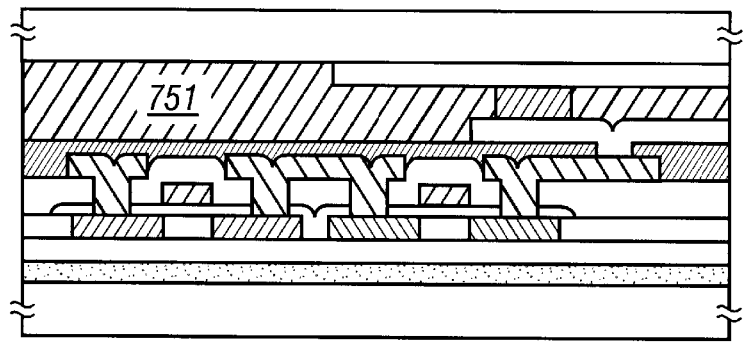

By processing at 120° C. for 15 minutes in an atmosphere containing nitrogen in an oven, electric connection and mechanical adhesion between the stick substrate 731 and the substrate 749 are completed. Before complete adhesion, it may be tested whether or not sufficient electrical connection state is obtained, by a method disclosed in Japanese Patent Application Open No. 7-14880, and then a main adhesion method may be utilized. (FIG. 16B)

The processed substrates are left within air flow of a mixture gas of fluorine trichloride ($ClF_3$) and nitrogen. A flow rate of fluorine trichloride and nitrogen is set to 500 sccm. A reaction process is 1 to 10 Torr. A temperature is a room temperature. It has been known that fluorine halide such as fluorine trichloride has a characteristic for selectively etching silicon. On the other hand, silicon oxide is not almost etched. However, oxides (silicon oxide and ITO) are not almost etched. Also, when a stable oxide film is formed on a surface of aluminum, since the reaction is stopped, etching is not performed.

Figure 16C:
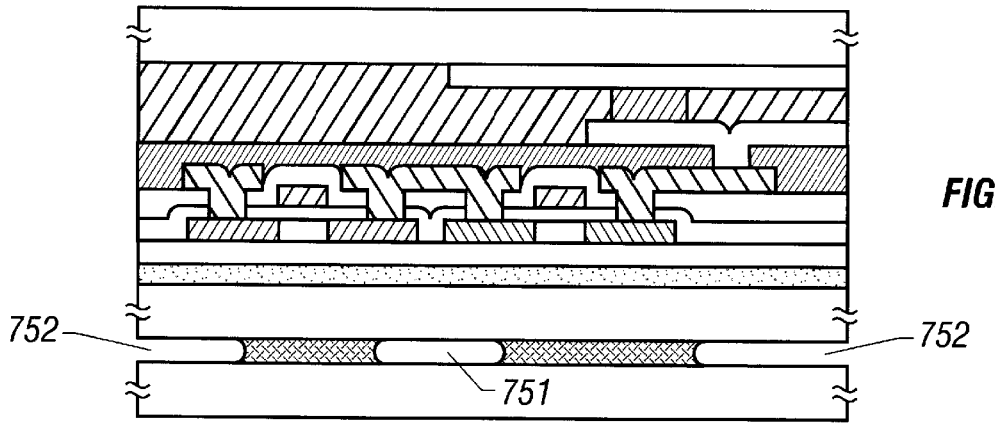

In the embodiment, a material which is etchable by fluorine trichloride is the peeling layer (silicon) 732, the silicon islands 734 and 735, the gate electrodes 737 and 738, the aluminum alloy wirings 742 to 744 and the adhesive 751. With respect to the materials other than the peeling layer 732 and the adhesive 751, since a material such as silicon oxide is formed outside the materials, fluorine trichloride cannot reach the materials. Actually, as shown in FIG. 16C, only the peeling layer 732 is etched selectively, thereby to form holes 752.

Figure 16D:
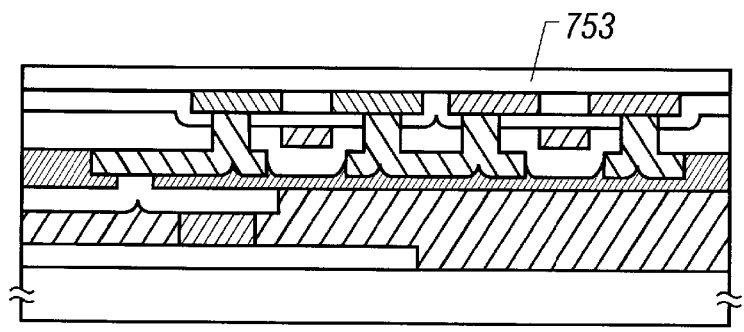
Figure 5A:
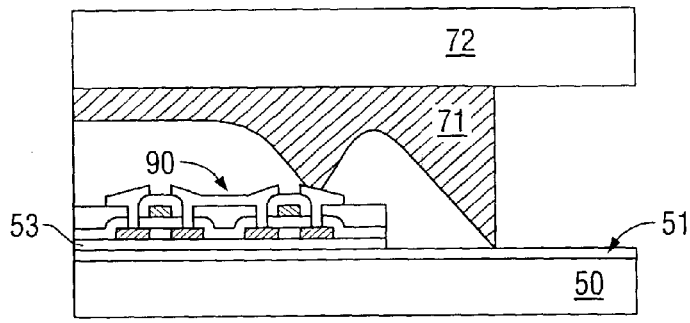
Figure 5B:
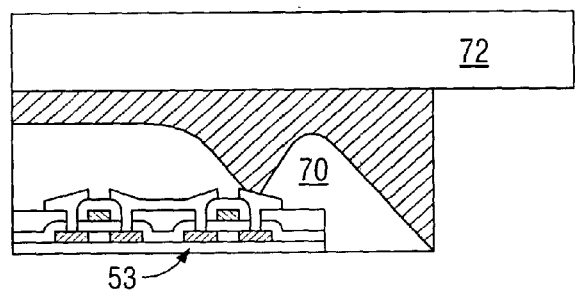
Figure 5C:
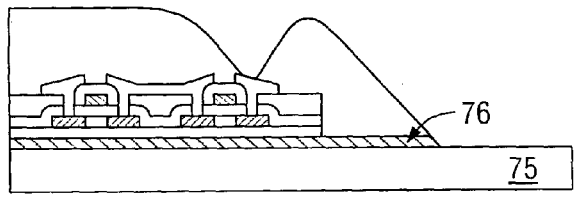
Figure 5D:
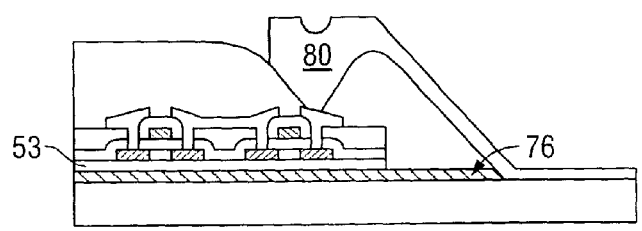

After some time elapses, the peeling layer 732 is etched completely, so that a bottom surface 753 of the base film 733 is exposed. Therefore, the stick substrate 731 can be separated from a semiconductor circuit. In etching using fluorine trichloride, since etching is stopped at the bottom surface 753 of the base film 733, the bottom surface 753 is extremely flat. (FIG. 16D)

By such processing, a transfer of the peripheral driver circuit from the stick substrate to one substrate of the liquid crystal display device is completed. Then, a polyimide film is formed as a protective film on the transferred peripheral driver circuit by adding varnish and then curing it. In the embodiment, Photoneath UR-3800 of Toray Industries Inc. is used. Addition is performed by a spinner (not shown). An addition condition may be determined in accordance with a desired film thickness. The polyimide film having a thickness of about 5 $\mu$m is formed at 2000 rpm for 20 seconds. After the addition is performed, drying, exposure and development are performed to remove an unnecessary polyimide. The film is then cured by processing it at 300° C. in an atmosphere containing nitrogen. It is important that a thickness of the polyimide film is set to be substantially the same as a diameter of spacers to be used later. Thus, it can be prevented that the spacers are present on the peripheral driver circuit. A thickness of the polyimide film may be set to be substantially the same as that of a seal material. However, in general, the thickness of the seal material is determined by the spacers, the thickness of the polyimide film is generally set to be the diameter of the spacers. In a passive matrix type display device, the other substrate is produced by substantially the same process as described above.

Next, a producing process for a passive matrix type liquid crystal display device is explained below.

The first and second substrates produced by the above processes are sufficiently washed to remove various chemicals such as an etching solution, a resist solution and a peeling solution which are used for surface-processing.

An orientation film is adhered to an electrode region which is made of ITO and constructs pixels. An orientation material is obtained by dissolving, in a solvent such as butyl cellosolve or N-methyl pyrrolidone, a polyimide having about 10 weight % of the solvent.

The orientation films adhered to the first and second substrates are heated and cured (baked). Then, rubbing treatment is performed so that a surface of a glass substrate to which the orientation film is adhered is rubbed in a desired direction by using a buff cloth (a fiber such as rayon and nylon) having a wool length of 2 to 3 mm at a surface and thus fine grooves are formed.

Spherical spacers of a polymer system, a glass system, a silica system or the like are scattered (dispersed) on one of the first and second substrates. A spacer scattering method includes a wet method for scattering, on a substrate, spacers into which a solvent such as pure water or alcohol is mixed and a dry method for scattering, on a substrate, spacers without using a solvent. In the embodiment, the dry method is used.

A resin used as a seal material provided in an outer side of a substrate is applied. The seal material to be used is obtained by dissolving an epoxy resin and a phenol curing agent in a solvent of ethyl cellosolve. An acrylate system resin may be used. Also, a thermal-curable type or a ultraviolet-curable type may be used.

By a screen printing method, a seal material is applied and formed on the first substrate or the second substrate.

After forming the seal material, two glass substrates are adhered to one another. As a method for adhering and curing, a heating curing method for curing a seal material for about 3 hours by high temperature press at about 160° C. is used.

A liquid crystal material is injected from a liquid crystal inlet of the passive matrix type display device produced by adhering the first and second substrates, and then the liquid crystal inlet is sealed by using an epoxy system resin.

Thus, the passive matrix type liquid crystal display device is completed.

[Embodiment 6]

The embodiment shows a schematic producing process for one substrate in a passive matrix type liquid crystal display device, using FIGS. 4A to 5D.

As described in Embodiment 1, the silicon film is deposited as the peeling layer 51 on the glass substrate 50. The silicon oxide film 53 is deposited as a base film on the peeling layer 51. The crystalline silicon islands 54 and 55 are formed. Also, by plasma CVD or thermal CVD, the silicon oxide is deposited as the gate insulating film 56, and then gate electrode-wirings 57 and 58 using crystalline silicon are formed.

An N-type and a P-type impurities are introduced into the silicon islands 54 and 55 by ion doping or the like, to form the N-type regions 59 and the P-type regions 60. The interlayer insulator 61 is deposited, and then contact holes are formed therein, to form the aluminum alloy wirings 62 to 64.

The polyimide film 70 is formed as a passivation film at 2000 rpm for 25 seconds by a spinner. The thickness of the polyimide film 70 is set in accordance with a diameter of spacers.

The transfer substrate 72 is adhered to the semiconductor integrated circuit by the resin 71.

The processed substrate is left within air flow of a mixture gas of fluorine trichloride and nitrogen. Fluorine halide such as fluorine trichloride has a characteristic for selectively etching silicon. On the other hand, silicon oxide is not almost etched. Thus, the peeling layer made of silicon is etched in accordance with an elapse. However, the base film 53 made of silicon oxide is not almost etched, so that a TFT element is not damaged. When further elapsing a time, the peeling layer 51 is etched completely, thereby to peel the semiconductor integrated circuit completely.

The peeled semiconductor integrated circuit is adhered to a substrate 75 of a liquid crystal display device by a resin 76 and then the transfer substrate 72 is removed. Thus, a transfer of the semiconductor integrated circuit to the substrate 75 of the liquid crystal display device is completed.

By sputtering, the ITO film 80 is formed. The ITO film is a transparent conductive oxide and patterned to complete electrical connection between the electrical wirings and the semiconductor integrated circuit.

As a result, the formation of the semiconductor integrated circuit on one substrate of the liquid crystal display device is completed. The liquid crystal display device is completed by using the obtained substrate.

Next, a producing process for a passive matrix type liquid crystal display device is explained below.

The first and second substrates produced by the above processes are sufficiently washed to remove various chemicals such as an etching solution, a resist solution and a peeling solution which are used for surface-processing.

An orientation film is adhered to an electrode region which is made of ITO and constructs pixels. An orientation material is obtained by dissolving, in a solvent such as butyl cellosolve or N-methyl pyrrolidone, a polyimide having about 10 weight % of the solvent.

The orientation films adhered to the first and second substrates are heated and cured (baked). Then, rubbing treatment is performed so that a surface of a glass substrate to which the orientation film is adhered is rubbed in a desired direction by using a buff cloth (a fiber such as rayon and nylon) having of a wool length of 2 to 3 mm at a surface and thus fine grooves are formed.

Spherical spacers of a polymer system, a glass system, a silica system or the like are scattered (dispersed) on one of the first and second substrates. A spacer scattering method includes a wet method for scattering, on a substrate, spacers into which a solvent such as pure water or alcohol is mixed and a dry method for scattering, on a substrate, spacers without using a solvent. In the embodiment, the dry method is used.

A resin used as a seal material provided in an outer side of a substrate is applied. The seal material to be used is obtained by dissolving an epoxy resin and a phenol curing agent in a solvent of ethyl cellosolve. An acrylate system resin may be used. Also, a thermal-curable type or a ultraviolet-curable type may be used.

By a screen printing method, a seal material is applied and formed on the first substrate or the second substrate.

After forming the seal material, two glass substrates are adhered to one another. As a method for adhering and curing, a heating curing method for curing a seal material for about 3 hours by high temperature press at about 160° C. is used.

A liquid crystal material is injected from a liquid crystal inlet of the passive matrix type display device produced by adhering the first and second substrates, and then the liquid crystal inlet is sealed by using an epoxy system resin.

Thus, the passive matrix type liquid crystal display device is completed.

In the present invention, it is possible to use various variations with respect to a kind, a thickness and a size of a substrate in a display device. For example, as described in Embodiment 1, a extremely thin film-shaped liquid crystal display device can be obtained. In this case, the display device may be adhered along a curved surface. Also, since a limitation of a kind of a substrate is relaxed, a material having light weight and high shock resistance, such as a plastic substrate, can be used, thereby to improve portability.

In particular, by forming periphery of end portions of an insulating film covering a semiconductor integrated circuit into a taper shape, a structure having no disconnection of a wiring in step portion can be formed at formation of wirings or after the formation. thus, reliability of a display device can be improved.

Also, since an occupying area a driver circuit is small, a degree of freedom in arrangement of one display device and another display device is increased. Typically, since a driver circuit can be arranged in an area (several mm in width) around a display surface, a display device itself is an extremely simple and fashionable product. Its application is extended to various fields.

According to the present invention, in a liquid crystal display device that a peripheral driver circuit is provided in a liquid crystal region wherein contamination resistance and humidity resistance of the peripheral driver circuit are improved and an external appearance is simple, breaking of the peripheral driver circuit due to a stress pressure to a substrate can be prevented and a substrate interval can be maintained constant. In particular, in a liquid crystal display device in which a plastic substrate modifiable by an external stress is used, breaking of the peripheral driver circuit can be prevented. Thus, reliability and durability of the liquid crystal display device can be improved further.

Thus, the present invention has an extremely high industrial value.

What is claimed is:

1. A method of manufacturing a passive type liquid crystal display comprising:

preparing a driver circuit on a temporary substrate;

attaching the driver circuit on the temporary substrate onto a first substrate; then removing the temporary substrate from the driver circuit;

forming a liquid crystal material between said first substrate and a second substrate; and using said first and second substrates, and said liquid crystal material to form a passive type liquid crystal display.

2. The method of claim 1 wherein the first and second substrates are made of plastic.

3. The method of claim 2 wherein the plastic comprises flexible material.

4. A method of manufacturing a passive type liquid crystal display having a pair of first and second substrates and a liquid crystal disposed therebetween, the method comprising the following sequential steps of:

preparing a driver circuit on a temporary substrate;

attaching the driver circuit from the temporary substrate onto the first substrate;

removing the temporary substrate from the driver circuit which is stuck on said temporary substrate;

forming a sealing member on a periphery of one of the first and second substrates; and then mating the first and second substrates with the sealing member therebetween, wherein the sealing member is arranged so as to enclose the liquid crystal and the driver circuit between the first and second substrates.

5. The method of claim 4 wherein the pair of first and second substrates are made of plastic.

6. The method of claim 5 wherein the plastic comprises flexible material.

7. The method of claim 4 wherein said mating the pair of first and second substrates are performed by curing a sealing member while pressing the substrates at 160° C. for 3 hours.

8. A method of manufacturing a liquid crystal display device having a pair of first and second substrates and a liquid crystal disposed therebetween, comprising:

forming a peeling layer comprising silicon on a glass substrate;

forming an underlying film on the peeling layer;

forming a semiconductor integrated circuit on the underlying film;

forming a passivation film on the semiconductor integrated circuit;

sticking a transfer substrate to the passivation film;

etching the peeling layer by using a mixture of gas comprising $ClF_3$ and $N_2$, thereby separating said semiconductor integrated circuit from the glass substrate;

after separating the semiconductor integrated circuit, attaching the semiconductor integrated circuit to one of said first and second substrates with said underlying film therebetween;

removing the transfer substrate from said semiconductor integrated circuit; and forming an electrode arrangement on said one of the first and second substrates, said electrode arrangement being operationally connected to said semiconductor integrated circuit.

9. The method of claim 8 wherein the liquid crystal display device is a passive type.

10. The method of claim 8 wherein the underlying film comprises silicon oxide.

11. The method of claim 8 wherein the passivation film comprises polyimide resin.

12. The method of claim 8 wherein curing the passivation film is performed under an atmosphere containing $N_2$ at 300° C.

13. The method of claim 8 wherein the etching process is performed under a pressure of between 1 and 10 torr at room temperature.

14. The method of claim 8 wherein the transfer substrate is made of plastic.

15. The method of claim 8 wherein the first and second substrates are made of plastic.

16. The method of claim 15 wherein the plastic comprises polyethersulfate having a thickness of 0.3 mm.

17. A method of manufacturing a liquid crystal display device having a pair of first and second substrates and a liquid crystal disposed therebetween, each of said first and second substrates having an electrode arrangement thereon, said method comprising:

forming a peeling layer on a glass substrate;

forming an underlying film on the peeling layer;

forming a semiconductor integrated circuit on the underlying film;

forming at least one passivation film over the semiconductor integrated circuit;

forming a contact hole through the passivation film to expose a portion of said semiconductor integrated circuit;

forming a lead on the passivation film, said lead being electrically connected to said semiconductor integrated circuit through the contact hole;

forming a conductive bump on the lead;

attaching said glass substrate provided with said semiconductor integrated circuit to one of the first and second substrates with an adhesive therebetween, wherein said semiconductor integrated circuit is electrically connected to the electrode arrangement of the one of the first and second substrates through said lead and said conductive bump; and etching the peeling layer for separating the semiconductor integrated circuit from the glass substrate.

18. The method of claim 17 where the liquid crystal display device is a passive type.

19. The method of claim 17 wherein the peeling layer comprises silicon.

20. The method of claim 17 wherein the passivation film comprises silicon nitride.

21. The method of claim 17 wherein the bump comprises gold.

22. The method of claim 17 wherein the adhesive comprises thermally curable organic resin which is cured under an atmosphere containing $N_2$ at 120° C. for 15 minutes.

23. The method of claim 17 wherein etching the peeling layer is performed by using a mixture gas comprising $ClF_3$ and $N_2$ under a pressure of 1 to 10 torr at a room temperature.

24. The method of claim 17 wherein the first and second substrates are made of plastic.

25. The method of claim 24 wherein the plastic comprises polyethersulfate having a thickness of 0.3 mm.

* * * * *

UNITED STATES PATENT AND TRADEMARK OFFICE
CERTIFICATE OF CORRECTION

PATENT NO. : 5,834,327
DATED : November 10, 1998
INVENTOR(S) : Setsuo Nakajima, Shunpei Yamazaki and Yasuyuki Arai It is certified that error appears in the above-identified patent and that said Letters Patent is hereby corrected as shown below:

Title page,
Item [57], ABSTRACT,
Line 7, change "that" to -- on which --;
Line 8, change "substrate, the" to -- substrate. The --;
Line 18, change "is" to -- are --.
Line 23, after "circuit" insert -- that --; delete "substan-"; and
Line 24, delete tially"; after "thickness" and insert -- substantially --;

Drawings,
Sheet 5 of 15, please replace (Figs 5A-5D) with the attached Figs. 5A-5D.

Column 4,
Line 40, change "become" to -- becomes --.

Column 10,
Lines 33, 34 and 37, replace "fluorine trichloride" with -- chlorine trifluoride --.

Column 12,
Lines 53, 54 and 56-57, replace "fluorine trichloride" with -- chlorine trifluoride --.

Column 15,
Lines 8, 9, 12, 19, 24 and 31-32, replace "fluorine trichloride" with -- chlorine trifluoride --.

Column 16,
Lines 62 and 63, replace "fluorine trichloride" with -- chlorine trifluoride --.

Signed and Sealed this

Thirty-first Day of August, 2004

JON W. DUDAS
*Director of the United States Patent and Trademark Office*